(12) United States Patent
Arai

(10) Patent No.: US 7,517,551 B2
(45) Date of Patent: Apr. 14, 2009

(54) METHOD OF MANUFACTURING A LIGHT-EMITTING DEVICE

(75) Inventor: Yasuyuki Arai, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 99 days.

(21) Appl. No.: 09/847,308

(22) Filed: May 3, 2001

(65) Prior Publication Data

US 2002/0009538 A1 Jan. 24, 2002

(30) Foreign Application Priority Data

May 12, 2000 (JP) ............................. 2000-141005

(51) Int. Cl.
*B05D 5/12* (2006.01)
*C23C 16/00* (2006.01)

(52) U.S. Cl. .............................. 427/70; 427/69; 427/64; 427/258; 427/402

(58) Field of Classification Search ................... 427/66; 428/690; 313/504
See application file for complete search history.

(56) References Cited

U.S. PATENT DOCUMENTS

| | | | |
|---|---|---|---|
| 2,351,536 A | 6/1944 | Osterberg et al. |
| 2,435,997 A | 2/1948 | Bennett |
| 2,906,637 A | 9/1959 | Auphan |
| 3,312,190 A | 4/1967 | Bradshaw |
| 3,543,717 A | 12/1970 | Adachi |
| 3,756,193 A | 9/1973 | Carmichael et al. |
| 3,931,490 A | 1/1976 | Grothe et al. |
| 3,931,789 A | 1/1976 | Kakei et al. |
| 3,971,334 A | 7/1976 | Pundsack |
| 4,023,523 A | 5/1977 | Ing |
| 4,187,801 A | 2/1980 | Monk |
| 4,225,805 A | 9/1980 | Smithgall et al. |
| 4,233,937 A | 11/1980 | Steube |
| 4,405,487 A | 9/1983 | Harrah et al. |

(Continued)

FOREIGN PATENT DOCUMENTS

DE 28 34 806 2/1980

(Continued)

OTHER PUBLICATIONS

Burrows et al., Organic Vapor Phase deposition: a new method for the growth of organic films with large optical non-linearities, 1995, Journal of Crystal Growth 156, pp. 91-98.*

(Continued)

*Primary Examiner*—Timothy H Meeks
*Assistant Examiner*—David Turocy
(74) *Attorney, Agent, or Firm*—Eric J. Robinson; Robinson Intellectual Property Law Office, P.C.

(57) ABSTRACT

A technique for manufacturing a light-emitting device by using a method of forming a thin film having a highly uniform thickness with high throughput is provided. The technique includes the steps of filling a small molecular organic electroluminescence material into an evaporation cell that has an orifice-like evaporation material ejecting port, and heating the small molecular organic electroluminescence material in an inert gas atmosphere to form a light emitting layer on a substrate from the small molecular organic electroluminescence material.

28 Claims, 8 Drawing Sheets

U.S. PATENT DOCUMENTS

| | | | |
|---|---|---|---|
| 4,446,357 A | 5/1984 | Barshter | |
| 4,469,719 A | 9/1984 | Martin | |
| 4,543,467 A | 9/1985 | Eisele et al. | |
| 4,592,306 A | 6/1986 | Gallego | |
| 4,596,735 A | 6/1986 | Noguchi et al. | |
| 4,602,192 A | 7/1986 | Nomura et al. | |
| 4,627,989 A | 12/1986 | Feuerstein et al. | |
| 4,672,265 A * | 6/1987 | Eguchi et al. | 313/504 |
| 4,769,292 A | 9/1988 | Tang et al. | |
| 4,885,211 A | 12/1989 | Tang et al. | |
| 4,897,290 A | 1/1990 | Terasaka et al. | |
| 4,951,601 A | 8/1990 | Maydan et al. | |
| 5,190,590 A | 3/1993 | Suzuki et al. | |
| 5,225,238 A * | 7/1993 | Ardaillon et al. | 427/2.15 |
| 5,258,325 A | 11/1993 | Spitzer et al. | |
| 5,259,881 A | 11/1993 | Edwards et al. | |
| 5,294,870 A * | 3/1994 | Tang et al. | 313/504 |
| 5,310,410 A | 5/1994 | Begin et al. | |
| 5,429,884 A | 7/1995 | Namiki et al. | |
| 5,512,320 A | 4/1996 | Turner et al. | |
| 5,534,314 A * | 7/1996 | Wadley et al. | 427/585 |
| 5,550,066 A | 8/1996 | Tang et al. | |
| 5,643,685 A | 7/1997 | Torikoshi | |
| 5,670,792 A | 9/1997 | Utsugi et al. | |
| 5,695,564 A | 12/1997 | Imahashi | |
| 5,701,055 A | 12/1997 | Nagayama et al. | |
| 5,817,366 A | 10/1998 | Arai et al. | |
| 5,844,363 A * | 12/1998 | Gu et al. | 313/506 |
| 5,902,688 A * | 5/1999 | Antoniadis et al. | 428/690 |
| 5,904,961 A | 5/1999 | Tang et al. | |
| 5,906,857 A | 5/1999 | McKee et al. | |
| 5,921,836 A * | 7/1999 | Nanto et al. | 445/24 |
| 5,935,395 A | 8/1999 | Ouellet et al. | |
| 5,937,272 A | 8/1999 | Tang | |
| 5,943,600 A | 8/1999 | Ngan et al. | |
| 5,945,967 A * | 8/1999 | Rallison et al. | 345/32 |
| 5,972,183 A | 10/1999 | Krueger et al. | |
| 6,001,413 A | 12/1999 | Matsuura et al. | |
| 6,011,904 A | 1/2000 | Mattord | |
| 6,023,308 A | 2/2000 | Takemura | |
| 6,049,167 A * | 4/2000 | Onitsuka et al. | 313/512 |
| 6,101,316 A * | 8/2000 | Nagashima et al. | 392/388 |
| 6,124,215 A | 9/2000 | Zheng | |
| 6,132,280 A | 10/2000 | Tanabe et al. | |
| 6,132,805 A | 10/2000 | Moslehi | |
| 6,149,392 A | 11/2000 | Conte | |
| 6,179,923 B1 | 1/2001 | Yamamoto et al. | |
| 6,237,529 B1 | 5/2001 | Spahn | |
| 6,244,212 B1 | 6/2001 | Takacs et al. | |
| 6,280,861 B1 | 8/2001 | Hosokawa et al. | |
| 6,294,892 B1 * | 9/2001 | Utsugi et al. | 318/640 |
| 6,296,894 B1 | 10/2001 | Tanabe et al. | |
| 6,299,746 B1 | 10/2001 | Conte et al. | |
| 6,319,321 B1 | 11/2001 | Hiraga et al. | |
| 6,326,726 B1 | 12/2001 | Mizutani et al. | |
| 6,333,065 B1 | 12/2001 | Arai et al. | |
| 6,337,105 B1 | 1/2002 | Kunieda et al. | |
| 6,340,501 B1 | 1/2002 | Kamiyama et al. | |
| 6,380,081 B1 | 4/2002 | Lee | |
| 6,382,895 B1 | 5/2002 | Konishi et al. | |
| 6,403,392 B1 | 6/2002 | Burrows et al. | |
| 6,432,561 B1 | 8/2002 | Yamazaki | |
| 6,469,439 B2 | 10/2002 | Himeshima et al. | |
| 6,482,752 B1 | 11/2002 | Yamazaki et al. | |
| 6,482,852 B2 | 11/2002 | Shakespeare et al. | |
| 6,495,198 B2 * | 12/2002 | Peng | 427/66 |
| 6,528,108 B1 | 3/2003 | Kawamura | |
| 6,537,607 B1 * | 3/2003 | Swanson | 427/66 |
| 6,633,121 B2 | 10/2003 | Eida et al. | |
| 6,641,674 B2 | 11/2003 | Peng | |
| 6,649,210 B2 | 11/2003 | Tokailin et al. | |
| 6,660,409 B1 | 12/2003 | Komatsu et al. | |
| 6,696,096 B2 | 2/2004 | Tsubaki et al. | |
| 6,776,880 B1 | 8/2004 | Yamazaki | |
| 6,827,622 B2 | 12/2004 | Yamada et al. | |
| 6,830,626 B1 | 12/2004 | Smith | |
| 2001/0006827 A1 | 7/2001 | Yamazaki et al. | |
| 2001/0009154 A1 | 7/2001 | Nguyen et al. | |
| 2001/0019807 A1 | 9/2001 | Yamada et al. | |
| 2001/0022272 A1 | 9/2001 | Plester et al. | |
| 2002/0011205 A1 | 1/2002 | Yamazaki et al. | |
| 2002/0076847 A1 | 6/2002 | Yamada et al. | |
| 2002/0081372 A1 | 6/2002 | Peng | |
| 2002/0084032 A1 | 7/2002 | Jeng et al. | |
| 2002/0155632 A1 | 10/2002 | Yamazaki et al. | |
| 2002/0179013 A1 | 12/2002 | Kido et al. | |
| 2002/0192499 A1 | 12/2002 | Tokailin et al. | |
| 2002/0197418 A1 | 12/2002 | Mizukami et al. | |
| 2002/0197760 A1 | 12/2002 | Yamazaki et al. | |
| 2003/0015140 A1 | 1/2003 | Van Slyke et al. | |
| 2003/0017259 A1 | 1/2003 | Yamada et al. | |
| 2003/0024479 A1 | 2/2003 | Kashiwaya et al. | |
| 2003/0101937 A1 | 6/2003 | Van Slyke et al. | |
| 2003/0124764 A1 | 7/2003 | Yamazaki et al. | |
| 2003/0180457 A1 | 9/2003 | Murakami et al. | |
| 2003/0219530 A1 | 11/2003 | Yamazaki et al. | |
| 2004/0035366 A1 | 2/2004 | Keum et al. | |
| 2004/0096694 A1 | 5/2004 | Tokailin et al. | |
| 2005/0005850 A1 | 1/2005 | Yamazaki | |

FOREIGN PATENT DOCUMENTS

| | | | |
|---|---|---|---|
| DE | 44 22 697 | | 1/1996 |
| EP | 0 955 791 | | 11/1999 |
| EP | 1 071 117 | | 1/2001 |
| EP | 1 113 087 | | 7/2001 |
| EP | 1 319 732 | | 6/2003 |
| JP | 54-127877 | | 10/1979 |
| JP | 57-123973 | | 8/1982 |
| JP | 58-177463 | | 10/1983 |
| JP | 60-032361 | | 3/1985 |
| JP | 60-121616 | | 6/1985 |
| JP | 61-015969 | | 1/1986 |
| JP | 63-079959 | | 4/1988 |
| JP | 63-186763 | | 11/1988 |
| JP | 64-042392 | | 2/1989 |
| JP | 02-173261 | | 7/1990 |
| JP | 04-116169 | | 4/1992 |
| JP | 04-268069 | | 9/1992 |
| JP | 05-304197 | | 11/1993 |
| JP | 06-088233 | | 3/1994 |
| JP | 06-306181 | | 11/1994 |
| JP | 07-018426 | | 1/1995 |
| JP | 07-192866 | | 7/1995 |
| JP | 07-252671 | | 10/1995 |
| JP | 08-111285 | | 4/1996 |
| JP | 09-016960 | | 1/1997 |
| JP | 09-209127 | | 8/1997 |
| JP | 09-256142 | | 9/1997 |
| JP | 09-256156 | | 9/1997 |
| JP | 10-041069 | | 2/1998 |
| JP | 10-168559 | | 6/1998 |
| JP | 10-195639 | | 7/1998 |
| JP | 10195639 | * | 7/1998 |
| JP | 10-214682 | | 8/1998 |
| JP | 10-335062 | | 12/1998 |
| JP | 11-229123 | | 8/1999 |
| JP | 2000-282219 | | 10/2000 |
| JP | 2000-328229 | | 11/2000 |
| JP | 2000-348859 | | 12/2000 |
| JP | 2001-089841 | | 4/2001 |
| JP | 2001-093667 | | 4/2001 |
| JP | 2001-152336 | | 6/2001 |
| JP | 2001-185350 | | 7/2001 |

| JP | 2001-247959 | 9/2001 |
| JP | 2003-002778 | 1/2003 |
| JP | 2003-017258 | 1/2003 |
| JP | 2003-034591 | 2/2003 |
| JP | 2003-095787 | 4/2003 |
| WO | WO 98/54375 | 12/1998 |
| WO | WO 01/31081 | 5/2001 |
| WO | WO 01/79581 | 10/2001 |

OTHER PUBLICATIONS

C.W. Tang et al., *Organic Electroluminescent Diodes*, Appl. Phys. Lett., vol. 51, No. 12, Sep. 21, 1987, pp. 913-915.

S.A. Van Slyke et al., *Blue Organic Light Emitting Devices*, Proceedings of the Electroluminescence Workshop, Jan. 1, 1996, pp. 195-200.

Y. Fukuda et al., *An Organic LED Display Exhibiting Pure RGB Colors*, Synthetic Metals, vol. 111-112, Jan. 1, 2000, pp. 1-6.

*Merriam-Webster's Collegiate Dictionary*, Tenth Edition, Jan. 1, 1998, p. 375, for definition of "elongated."

European Search Report dated Oct. 9, 2003 for Application No. 00128521.2.

European Search Report dated Jun. 20, 2003 for Application No. 03003757.6.

European Search Report dated Sep. 6, 2004 for Application No. 03007979.2.

Van Slyke et al., "27.2: Linear Source Deposition of Organic Layers for Full-Color OLED," SID International Symposium Digest of Technical Papers, 2002, pp. 886-889.

\* cited by examiner

METHOD OF MANUFACTURING A LIGHT-EMITTING DEVICE

BACKGROUND OF THE INVENTION

1. Field of the Invention

The present invention relates to a method of forming a thin film used to manufacture an EL (electroluminescence) element comprised of an anode, a cathode, and a luminous material, a light-emitting organic material (hereinafter referred to as an organic EL material) in particular, that is sandwiched between the anode and the cathode to provide electroluminescence.

The electroluminescence or light emission herein refers to either fluorescence from singlet excitation or phosphorescence from triplet excitation, or both.

2. Description of the Related Art

In recent years, development is proceeding on display devices using an EL element as a light-emitting element that emits light through EL phenomenon of an organic EL material (hereinafter referred to as EL display devices). Being light-emitting, the EL display devices do not need backlight unlike liquid crystal display devices. The EL display devices also have a wide viewing angle, which makes them prospective display units for portable equipment used outdoors.

The EL display devices can be divided into two types; passive (passive matrix) EL display devices and active (active matrix) EL display devices. Both types are vigorously being developed. Of the two, the active matrix EL display devices particularly attract attention at present. EL materials for forming a light emitting layer of an EL element can be divided into organic materials and inorganic materials. The organic materials are classified further into small molecular organic EL materials and polymer organic EL materials. They are equally actively researched. The small molecular organic EL materials are deposited mainly by evaporation whereas the polymer organic EL materials are deposited mainly by coating.

In order to manufacture a color EL display device, EL materials emitting different colors of light have to be deposited separately to form pixels of different colors. However, patterning by photolithography is not an option because EL materials are generally weak against moisture and oxygen. It is thus necessary to deposit the EL materials and pattern them at the same time.

The most common method therefore is to place a mask of a metal plate or a glass plate with openings (hereinafter referred to as shadow mask) between an evaporation source and a substrate on which the EL materials are to be deposited. According to this method, the EL materials evaporated from the evaporation source passes only through the openings so that the materials are deposited selectively. The deposition and patterning of the EL layer can thus be achieved simultaneously.

Every conventional evaporation device uses a single evaporation source and an EL material radially discharged from the source is deposited on the substrate to form a thin film. For that reason, suitable arrangement of the substrate has to be thought out in accordance with how far the discharged material flies. For instance, fixing the substrate to a conical substrate holder has been thought out so that the distance from the evaporation source to the substrate is the same for all the directions.

However, the above method requires an oversize substrate holder in the case of employing a multi-pattern process in which a plurality of panels are formed on a large-area substrate, leading to an increase in size of the film forming apparatus itself. On the other hand, a single wafer method has difficulties in forming a film of uniform thickness because the substrate is flat to vary the distance from the evaporation source to points within the substrate surface.

The large substrate also requires setting the distance between the evaporation source and the shadow mask long in order to disperse the evaporated EL material sufficiently and form a thin film uniformly over the entire surface of the substrate. Setting this distance long is another factor in enlargement of the apparatus.

SUMMARY OF THE INVENTION

The present invention has been made in view of the above problems, and an object of the present invention is therefore to provide a technique for manufacturing a light-emitting device by using a method of forming a thin film having a highly uniform thickness with high throughput.

In order to attain the object above, a structure of the present invention is characterized by comprising the steps of:

filling a small molecular organic electroluminescence material into an evaporation cell; and heating the small molecular organic electroluminescence material in an inert gas atmosphere to form a light emitting layer on a substrate from the small molecular organic electroluminescence material.

Another structure of the present invention is characterized by the steps of:

placing in a reaction chamber an evaporation source that has an evaporation cell containing a small molecular organic electroluminescence material and placing a shutter over an orifice of the evaporation cell;

heating the small molecular organic electroluminescence material in an inert gas atmosphere; and opening and closing the shutter to form a light emitting layer on one surface of a substrate from the small molecular organic electroluminescence material, the substrate being fixed to a sample stage.

Another structure of the present invention is characterized by comprising the steps of:

filling a small molecular organic electroluminescence material into an evaporation cell; and heating the small molecular organic electroluminescence material in an inert gas atmosphere to selectively form a light emitting layer on a substrate from the small molecular organic electroluminescence material.

Another structure of the present invention is characterized by comprising the steps of:

placing in a reaction chamber an evaporation source that has an evaporation cell containing a small molecular organic electroluminescence material and placing a shutter over an orifice of the evaporation cell;

heating the small molecular organic electroluminescence material in an inert gas atmosphere; and opening and closing the shutter to selectively form a light emitting layer on one surface of a substrate from the small molecular organic electroluminescence material, the substrate being fixed to a sample stage.

An evaporation cell having an orifice-like evaporation material ejecting port is used as an evaporation source, which makes it possible to selectively deposit an organic electroluminescence material on a substrate. In order to deposit by evaporation the organic electroluminescence material over a wide region within the substrate surface, one or both of the substrate and the evaporation cell are moved during the evaporation. The move of the substrate or the evaporation cell, or both, is associated with opening and closing of the shutter, which makes it possible to deposit the organic electroluminescence material as if to draw a pattern with strokes.

Adopting the above structures of the present invention allows the substrate to have a selectively formed layer made of an organic electroluminescence material in a given region without using a shadow mask or the like. In this specification, an evaporation method as above is referred to as gasification evaporation and a device using the evaporation method is referred to as gasification evaporation device.

BRIEF DESCRIPTION OF THE DRAWINGS

In the accompanying drawings:

FIG. 4A is a top view thereof and FIG. 4B is a sectional view thereof;

DETAILED DESCRIPTION OF THE PREFERRED EMBODIMENTS

Embodiment 1

Figure 1:
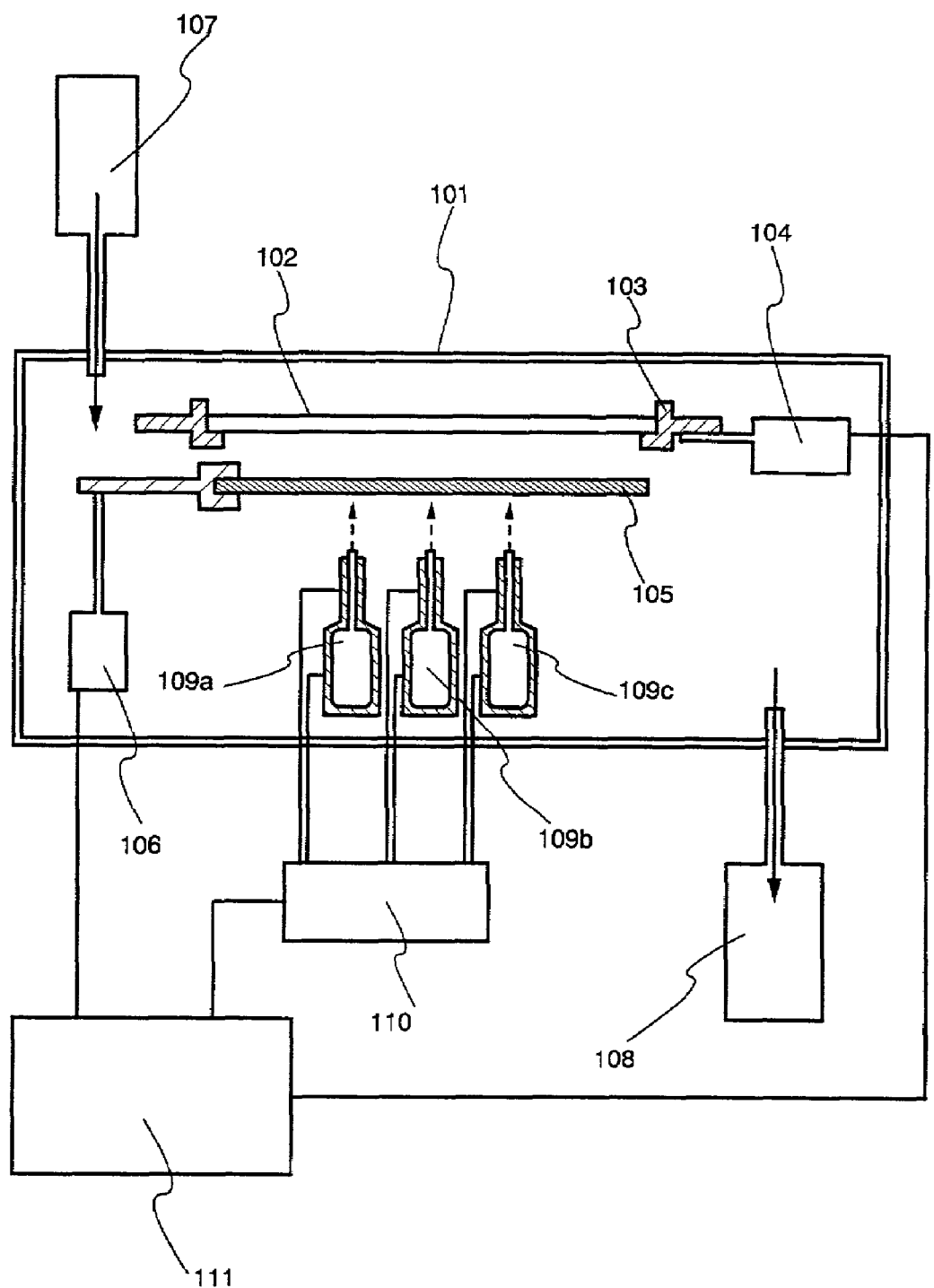
FIG. 1 is a diagram illustrating the structure of an evaporation device.

FIG. 1 is a diagram illustrating the structure of a gasification evaporation device according to the present invention. A reaction chamber 101 is an air-tight container and the interior thereof is completely shut out from the outside air. The reaction chamber 101 is filled with inert gas (typically, argon) supplied from gas introducing means 107. The gas is kept at the same pressure as the atmospheric pressure ($1.01 \times 10^5$ Pa). Discharging means 108 is activated as the need arises to circulate the inert gas or to discharge the gas.

One or plural evaporation cells used as evaporation sources are provided depending on the need. In FIG. 1, an evaporation cell (1) 109a, an evaporation cell (2) 109b, and an evaporation cell (3) 109c, three in total, are provided. The temperature of these evaporation cells is controlled by heating means 110.

A substrate 102 is fixed to a sample stage 103. A shutter automatically opening and closing is interposed between the substrate and the evaporation cells. A computer 111 centrally controls control means 104 for moving the sample stage 103 in the horizontal direction, control means 106 for opening and closing the shutter 105, and the heating means 110, which operate in association with one another. The associated operation makes it possible to form a pre-programmed evaporation pattern on the substrate 102 without using a shadow mask.

Figure 2:
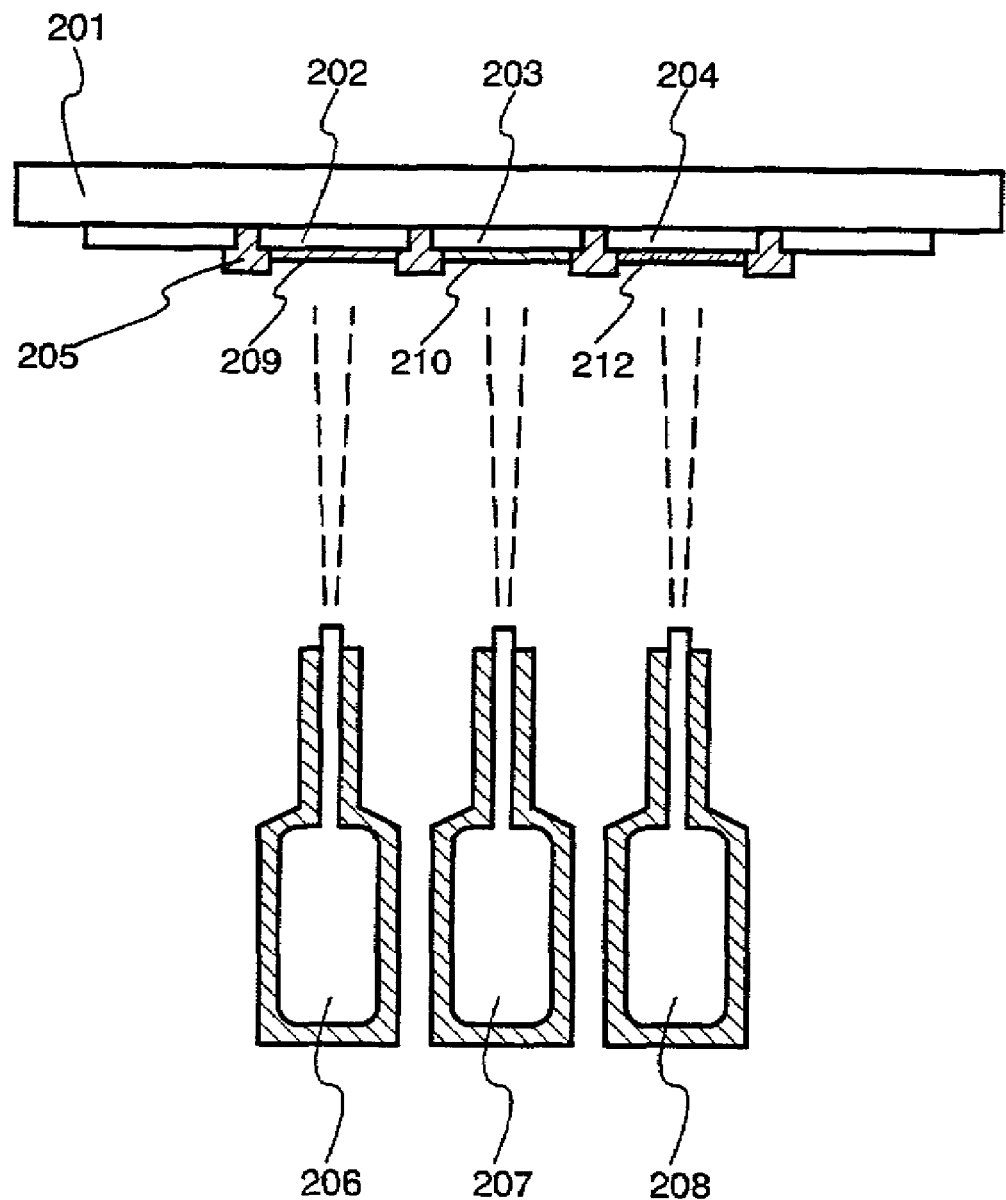
FIG. 2 is a diagram illustrating an evaporation cell and an evaporation method.

FIG. 2 is a diagram given for a simple explanation of this gasification evaporation. Evaporation cells 206 to 208 contain evaporation materials and are heated to the evaporation temperature. Each evaporation cell is formed of boron nitride, alumina, tungsten, or the like, and has its tip formed into an orifice with a diameter of several tens to several hundreds μm. When the evaporation cells are heated by a heater, the pressure in the evaporation cells is risen to gasify the contained materials and the flux distribution of the evaporation materials ejected through the orifices gains directivity.

The directivity is determined in accordance with the orifice diameter and the thickness thereof. Since the deposition takes place under the atmospheric pressure, the gasified and evaporation materials have small mean free process and the evaporation materials can be deposited on the substrate while maintaining a relatively high directivity.

The position of the substrate and the orifice is controlled so that evaporation films 209 to 212 are formed at positions that coincide with positions of pixel electrodes 202 to 204 formed on a substrate 201. A bump 205 is useful in separating adjoining evaporation films.

With the gasification evaporation device as above, a given pattern of evaporation films can be formed on a substrate without using a shadow mask. In this case, the pattern can have a width of about 50 to 200 μm. The substrate is placed on a sample stage and hence is movable in the horizontal direction (direction X-Y). By associating the movement of the substrate with opening and closing of the shutter and by using the evaporation cells illustrated in FIG. 2, minute patterns can be drawn on a large-area substrate.

Figure 3:
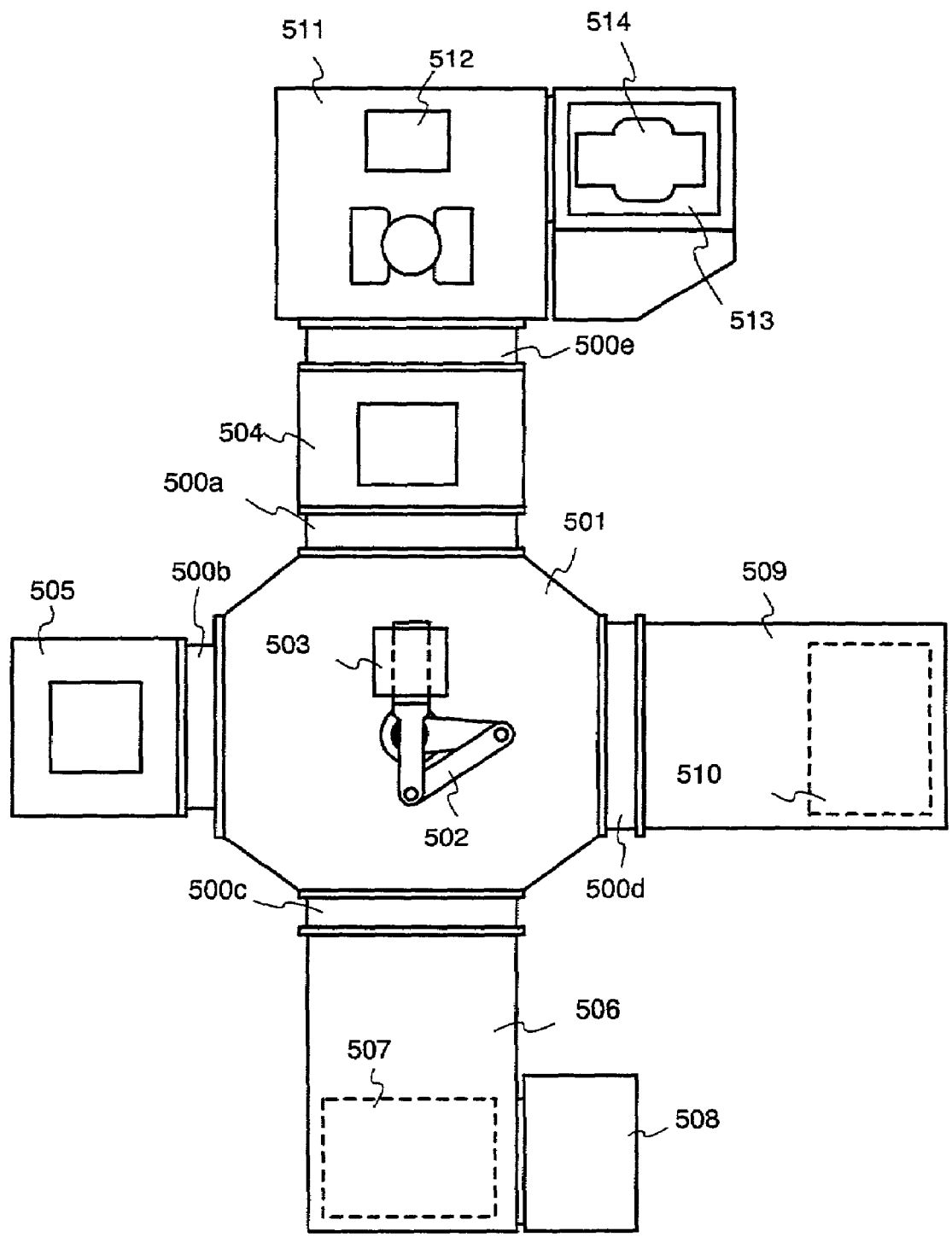
FIG. 3 is a diagram illustrating an apparatus used in manufacturing a light-emitting device.

A description given next with reference to FIG. 3 is an example of a film forming apparatus suitable for manufacturing a light-emitting device. In FIG. 3, reference symbol 501 denotes a transfer chamber and the transfer chamber 501 is provided with a transferring mechanism 502 to carry a substrate 503. The interior of the transfer chamber 501 is set to the atmospheric pressure and is filled with inert gas. Gates 500a to 500e each separate one processing chamber from other chambers. The substrate is carried from one processing chamber to another by the transferring mechanism 502 when the associated gate is opened.

Reference symbol 504 denotes a loading chamber for setting the substrate and the loading chamber also serves as an unloading chamber. The loading chamber 504 is connected to the transfer chamber 501 through the gate 500a, and this is where a carrier (not shown) in which the substrate 503 is set is placed. The loading chamber 504 may be divided into a room for bringing the substrate in and a room for sending the substrate out.

The substrate 503 supplied to the apparatus has finished the manufacture process up through formation of a transparent conductive film to serve as an anode of an EL element. The substrate 503 is set in the carrier with its film forming surface facing downward. This is to facilitate a face down method (also called deposit up method) at a later step of forming a film by evaporation. The face down method refers to a method in which the film is formed while the film forming surface of the substrate faces downward. This method prevents dusts from settling onto the film forming surface.

Next, denoted by 505 is a processing chamber for processing the surface of the anode of the EL element or a cathode thereof (hereinafter referred to as pre-processing chamber). The pre-processing chamber 505 is connected to the transfer chamber 501 through the gate 500b. The pre-processing chamber can be modified so as to suit a process of manufacturing an EL element, but any modified pre-processing chamber has to be capable of heating the substrate at 100 to 120° C. while irradiating the surface of the anode made of a transparent conductive film with ultraviolet light in oxygen. Pre-processing as such is effective in treating the surface of the anode of the EL element.

The next processing chamber is an evaporation chamber denoted by 506. The chamber 506 is for depositing an organic EL material through evaporation and is called an evaporation chamber (A). The evaporation chamber (A) 506 is connected to the transfer chamber 501 through the gate 500c. The evaporation chamber (A) 506 provided here has the structure shown in FIG. 1.

In a film forming unit 507 inside the evaporation chamber (A) 506, a hole injection layer is first formed over the entire surface of the substrate. Subsequently, a light emitting layer emitting red light is formed, then a light emitting layer emitting green light, and then a light emitting layer emitting blue light. The hole injection layer, the light emitting layer emitting red light, the light emitting layer emitting green light and the light emitting layer emitting blue light can be formed from arbitrary materials.

The structure of the evaporation chamber (A) 506 allows the evaporation sources to be switched in accordance with the kind of organic materials to be deposited. Specifically, a preparatory chamber 508 storing plural kinds of evaporation cells is connected to the evaporation chamber (A) 506 so that its interior transferring mechanism can replace an evaporation cell in 506 with an evaporation cell in 508. Accordingly, the evaporation cells are switched every time the organic EL materials to be deposited change. A shadow mask is moved by a distance corresponding to one pixel whenever the organic EL material forming the same mask is changed.

The deposition method used in the evaporation chamber (A) 506 is the one illustrated in FIGS. 1 and 2.

Next, reference symbol 509 denotes an evaporation chamber for forming by deposition a conductive film (metal film serving as the cathode) serving as the anode or cathode of the EL element, and the chamber 509 is called an evaporation chamber (B). The evaporation chamber (B) 509 is connected to the transfer chamber 501 through the gate 500d. The evaporation chamber (B) 509 provided here has the structure shown in FIG. 2. In a film forming unit 510 inside the evaporation chamber (B) 509, an Al—Li alloy film (film of an alloy of aluminum and lithium) is formed as a conductive film to serve as the cathode of the EL element. The gasification evaporation can also be applied to formation of an alloy film as this.

A processing chamber that comes next is a sealing chamber (also called an enclosing chamber or a glove box) 511, which is connected to the loading chamber 504 through the gate 500e. In the sealing chamber 511, the final processing of sealing the EL element in an air-tight space is conducted. This processing is to protect the fabricated EL element against oxygen and moisture, and uses methods such as automatic sealing using a sealing member or sealing with a thermally-curable resin or a UV-curable resin.

The sealing member can be formed from a material such as glass, ceramics, plastics and metals, but the material has to be light-transmissive if the EL element emits light toward the sealing member side. The sealing member is bonded to the substrate on which the EL element is formed by curing a thermally-curable resin or a UV-curable resin through heat treatment or irradiation of ultraviolet light. The air-tight space is thus formed. It is also effective to place a hygroscopic material represented by barium oxide in this air-tight space.

The space between the sealing member and the substrate on which the EL element is formed may be filled with a thermally-curable resin or a UV-curable resin. In this case, to add a hygroscopic material represented by barium oxide in the thermally-curable resin or the UV-curable resin is effective.

In the film forming apparatus shown in FIG. 3, the sealing chamber 511 has therein a mechanism 512 for irradiating ultraviolet light (hereinafter referred to as ultraviolet light irradiation mechanism). The ultraviolet light irradiation mechanism 512 emits ultraviolet light to cure the UV-curable resin. The interior of the sealing chamber 511 may be set to reduced pressure if a vacuum pump is provided. When the above sealing step is automated through operation of robots, the reduced pressure in the sealing chamber prevents oxygen and moisture from entering the chamber. Alternatively, the interior of the sealing chamber 511 may be pressurized. In this case, it is pressurized while being purged with nitrogen gas or rare gas of high purity to prevent oxygen and the like of the outside air from entering the chamber.

Next, a handing-over chamber (pass box) 513 is connected to the sealing chamber 511. The handing-over chamber 513 is provided with a transferring mechanism (B) 514, which brings the substrate whose EL element has been enclosed through the processing in the sealing chamber 511 into the handing-over chamber 513. The interior of the handing-over chamber 513 may also be set to reduced pressure if a vacuum pump is provided. The handing-over chamber 513 is provided to avoid direct exposure of the sealing chamber 511 to the outside air, and the substrate is taken out from the handing-over chamber.

As has been described in the above, the film forming apparatus shown in FIG. 3 is capable of keeping the substrate away from the outside air until after the EL element is completely enclosed in an air-tight space. This make the film forming apparatus capable of manufacturing an EL display device of higher reliability.

Figure 4A:
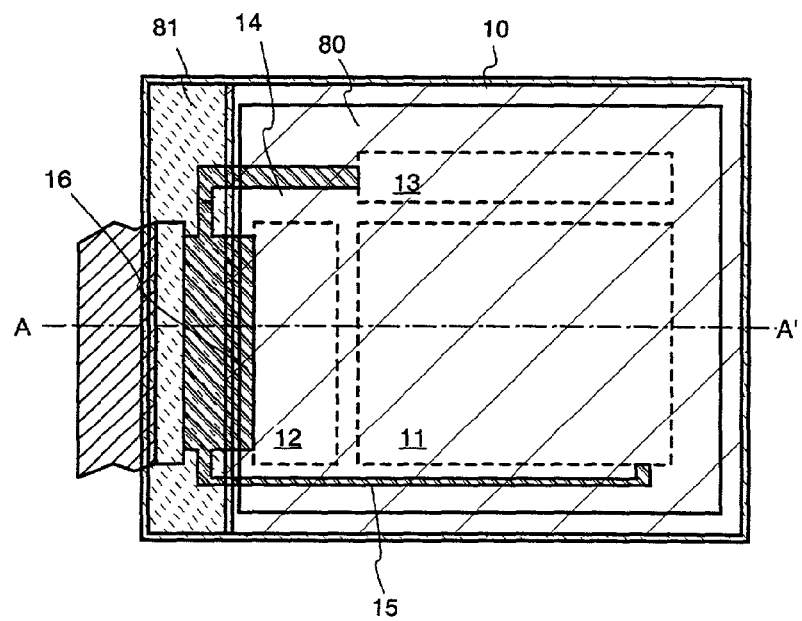
FIGS. 4A and 4B are diagrams showing the structure of an EL display device, where

Now, a description is given on an example of using this film forming apparatus to manufacture a light-emitting display panel that uses an EL material (hereinafter referred to as EL display device). FIG. 4A is a top view of the EL display device. In FIG. 4A, reference symbol 10 denotes a substrate, 11, a pixel portion, 12, a source side driver circuit, and 13, a gate side driver circuit. The driver circuits are respectively led to an FPC 17 through wirings 14 to 16 and connected to external equipment.

Figure 4B:
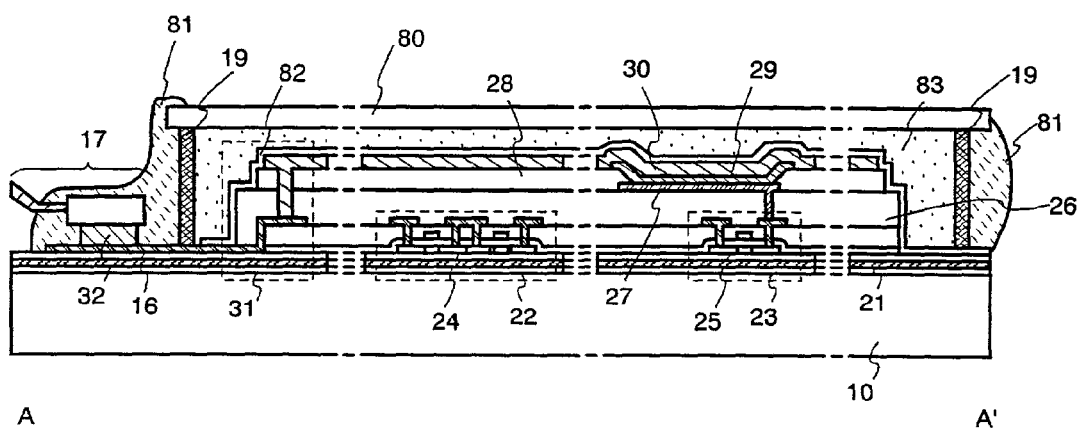

FIG. 4B shows a sectional view taken along the line A-A' of FIG. 4A. An opposite substrate 80 is provided at least above the pixel portion, preferably, above the pixel portion and the driver circuits. The opposite substrate 80 is bonded, using a sealing agent 19, to an active matrix substrate on which TFT's and a light-emitting layer made of an EL material are formed. The sealing agent 19 has a filler (not shown) mixed therein, which enables the two substrates to be bonded with an almost uniform distance. The exterior of the sealing agent 19 and the top and peripheral surface of the FPC 17 are sealed with an enclosing agent 81. The enclosing agent 81 is formed from a silicone resin, an epoxy resin, a phenol resin, butyl rubber, or the like.

When an active matrix substrate 10 is bonded to the opposite substrate 80 with the sealing agent 19, a space is formed therebetween. The space is filled with a filling agent 83. The filling agent 83 also has an effect of adhering the opposite substrate 80. As the filling agent 83, PVC (polyvinyl chloride), an epoxy resin, a silicone resin, PVB (polyvinyl butylal), EVA (ethylene vinylacetate), or the like can be used. The light-emitting layer is weak against moisture or humidity and is liable to degrade. Therefore it is desirable to mix a drying agent such as barium oxide in the filling agent 83 to maintain the moisture absorbing effect. A silicon nitride film or a silicon oxynitride film is formed as a passivation film 82 on the light-emitting layer in order to prevent corrosion caused by an alkaline element contained in the filling agent 83.

The opposite substrate 80 may be a glass plate, an aluminum plate, a stainless-steel plate, an FRP (fiberglass-reinforced plastics) plate, a PVF (polyvinyl fluoride) film, a Mylar film (trade name for a product of DuPont), a polyester film, an acrylic film, an acrylic plate, or the like. A sheet consisting of aluminum foil several tens μm in thickness and PVF films or Mylar films sandwiching the aluminum foil may be used to enhance resistance against moisture. The EL element is thus sealed and shut out from the outside air.

In FIG. 4B, formed on the substrate 10 and a base film 21 are a driver circuit TFT (shown here is a CMOS circuit using an n-channel TFT and a p-channel TFT in combination) 22 and a pixel portion TFT (only a TFT for controlling a current to the EL element is shown here) 23. The TFTs, the n-channel TFT in particular, have LDD regions structured as shown in this embodiment in order to prevent a decrease in ON current due to the hot carrier effect and to prevent characteristic degradation due to Vth shift and bias stress.

Manufacture of the EL display device is continued and an interlayer insulating film (leveling film) 26 is formed from a resin material on a source wiring and a drain wiring. On the interlayer insulating film 26, a pixel electrode 27 electrically connected to a drain of the pixel portion TFT 23 is formed from a transparent conductive film. The transparent conductive film may contain a compound of indium oxide and a tin oxide (this compound is called ITO) or a compound of indium oxide and zinc oxide. After forming the pixel electrode 27, an insulating film 28 is formed and an opening is formed in the insulating film over the pixel electrode 27.

A light-emitting layer 29 is then formed. The light-emitting layer 29 may have a single layer structure or a laminate structure in which known EL materials to form a hole injection layer, a hole transportation layer, a light emitting layer, an electron transportation layer and an electron injection layer are layered in an arbitrary combination. Whichever structure is to be formed, known techniques can be used. The EL materials preferable for the present invention are small molecular materials and are deposited by gasification evaporation.

In the light-emitting layer, wavelengths of light emitted from light emitting layers (red light emitting layers, green light emitting layers and blue light emitting layers) are different between different pixels, thereby enabling the device to display in color. Other methods to obtain color display include combining a color conversion layer (CCM) with color filters and combining a white light emitting layer with color filters, and either one can be employed. The EL display device may of course be a monochrome light emitting display device.

After forming the light-emitting layer 29, a cathode 30 is formed thereon. Desirably, moisture and oxygen in the interface between the cathode 30 and the light-emitting layer 29 are removed as much as possible. This requires some cotrivance such as forming the light-emitting layer 29 and the cathode 30 successively in vacuum or forming the light-emitting layer 29 in an inert atmosphere to then form the cathode 30 in vacuum without exposing it to the air. The film formation as above can be carried out by using a film forming apparatus of multi-chamber type.

Y (yttrium) is used for the cathode 30. The cathode 30 is connected to the wiring 16 in a region denoted by 31. The wiring 16 is a power supply line for applying a given voltage to the cathode 30, and is connected to the FPC 17 through anisotropic conductive paste material 32. A resin layer 80 is formed on the FPC 17 to enhance the adhesion of this portion.

In order to electrically connect the cathode 30 with the wiring 16 in the region denoted by 31, a contact hole has to be formed through the interlayer insulating film 26 and the insulating film 28. The contact hole is formed when the interlayer insulating film 26 is etched (upon forming a contact hole for the pixel electrode) and when the insulating film 28 is etched (upon forming the opening prior to the formation of the light-emitting layer). Alternatively, the contact hole may be formed by etching the insulating film 28 all the way through the interlayer insulating film 26. In this case, the contact hole can be shaped appropriately if the interlayer insulating film 26 and the insulating film 28 are formed from the same resin material.

The wiring 16 passes through a gap between the sealing agent 19 and the substrate 10 (the gap is filled with the enclosing agent 81) to be electrically connected to the FPC 17. Although the description given here is about the wiring 16, the other wirings 14 and 15 similarly pass under the sealing agent 19 to be electrically connected to the FPC 17.

Figures 5A, 5B:
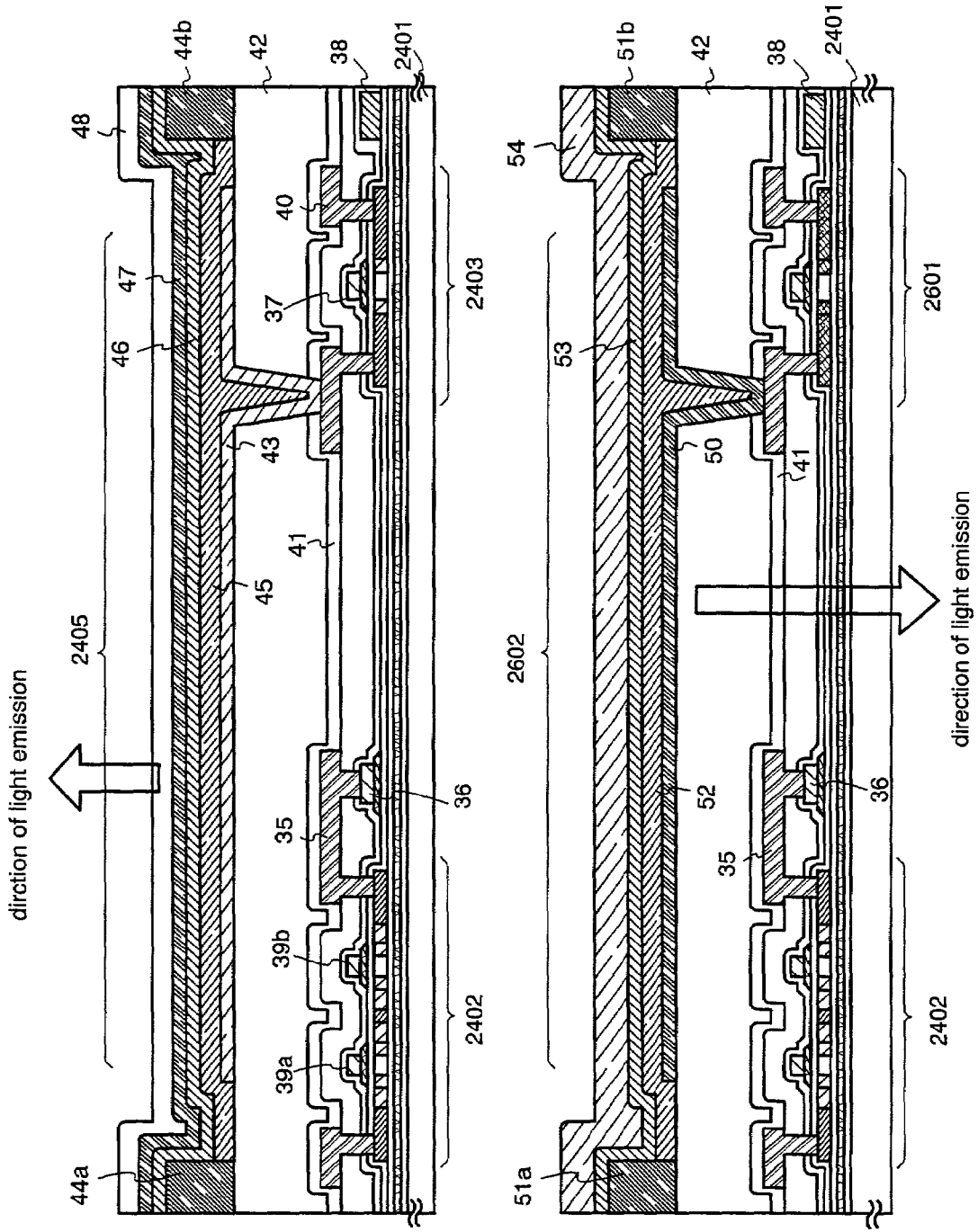
FIGS. 5A and 5B are sectional views showing a pixel portion of an EL display device.
Figure 6A:
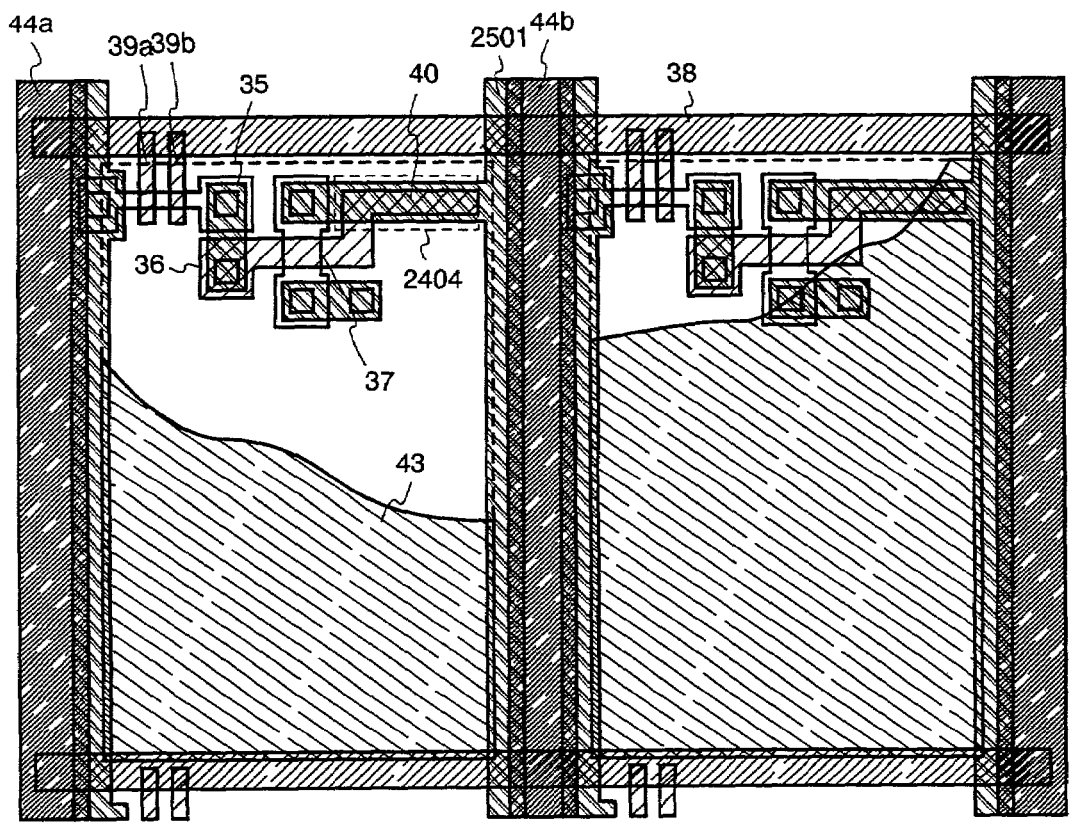
FIGS. 6A and 6B are a top view of a pixel portion of an EL display device and a circuit diagram thereof, respectively.
Figure 6B:
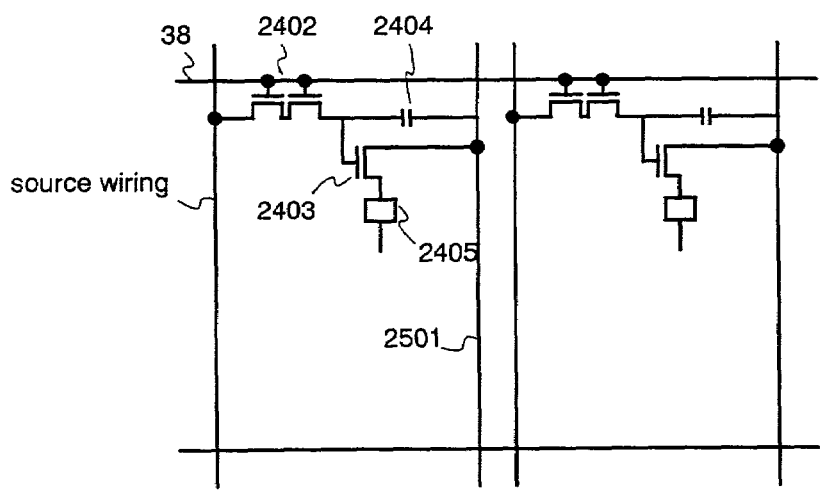

FIGS. 5A and 5B each show a more detailed sectional structure of the pixel portion. FIG. 6A and FIG. 6B show a top structure of the pixel portion and a circuit diagram thereof, respectively. In FIG. 5A, a switching TFT 2402 formed on a substrate 2401 has a double gate structure in which substantially two TFTs are connected in series. An LDD region having an offset region that does not overlap with a gate electrode can thus be formed, thereby providing an advantage of reduced OFF current value. Although the TFT here has a double gate structure, it may take a triple gate structure or a multi-gate structure having more than three gates.

An n-channel TFT is used for a current controlling TFT 2403. This TFT has a structure in which an LDD region overlapping with a gate electrode is formed only on the drain side. The structure reduces the parasitic capacitance between the gate and the drain and reduces the serial resistance, thereby increasing a current driving ability. This structure is also significant from another viewpoint. The current controlling TFT is an element for controlling the amount of current flowing into the EL element, and hence a large amount of current flows through the TFT to increase the risk of degradation by heat or by hot carriers. Therefore, the degradation of the current controlling TFT is prevented and stability in operation of the current controlling TFT can be improved by providing it with an LDD region partially overlapping with a gate electrode. In this case, a drain 35 of the switching TFT 2402 is electrically connected to a gate electrode 37 of the current controlling TFT through a wiring 36. A wiring denoted by 38 is a gate line for electrically connecting gate electrodes 39a and 39b of the switching TFT 2402 with each other.

The current controlling TFT 2403 shown here has a single gate structure. However, it may take a multi-gate structure in which a plurality of TFTs are connected in series. Another structure may be employed in which a plurality of TFTs are connected in parallel to substantially divide a channel forming region into plural sections, thereby releasing heat with high efficiency. This structure is effective as countermeasures against degradation by heat.

As shown in FIG. 6A, a wiring serving as the gate electrode 37 of the current controlling TFT 2403 overlaps with a drain line 40 of the current controlling TFT 2403 in a region denoted by 2404 through the insulating film. A capacitor is formed in the region denoted by 2404. The capacitor 2404 functions as a capacitor for holding the voltage applied to the gate of the current controlling TFT 2403. The drain line 40 is connected to a current supply line (power line) 2501, and the voltage applied to the drain line 40 is kept constant.

A first passivation film 41 is formed on the switching TFT 2402 and the current controlling TFT 2403. A leveling film 42 is formed from a resin insulating film on the first passivation film. It is very important to level the level difference caused by the TFTs with the leveling film 42. If the level difference exists, defective light emission may take place because the light-emitting layer to be subsequently formed is very thin. Therefore it is desirable to even out the level difference before forming the pixel electrode so that the light-emitting layer can be formed on as flat surface as possible.

Denoted by 43 is a pixel electrode (cathode of the EL element) formed of a highly reflective conductive film. The pixel electrode 43 is electrically connected to the drain of the current controlling TFT 2403. A low resistant conductive film such as an aluminum alloy film, a copper alloy film and a silver alloy film, or a laminate film obtained by layering these alloy films is preferably used for the pixel electrode 43. The pixel electrode may of course be a laminate film of the low resistant conductive film and other conductive films. An insulating film (preferably a resin film) is used to form banks 44a and 44b, which form a groove (corresponding to a pixel) therebetween. A light emitting layer 45 is formed in the groove. Although FIG. 6A shows only one pixel, light emitting layers each emitting one of red light, green light and blue light may be formed separately.

The light-emitting layer emitting white light is composed of a hole injection layer 46 formed of PEDOT (polythiophene) or Pani (polyaniline), a blue light emitting layer formed of STAD, a green and red light emitting layer formed of $Alq^3$+DCM, and an electron transportation layer formed of $Alq^3$. These are small molecular materials and can be deposited successively by gasification evaporation.

The light-emitting layer thus has a laminate structure in which the hole injection layer 46 formed of PEDOT (polythiophene) or Pani (polyaniline) is layered on the light emitting layer 45. On the hole injection layer 46, an anode 47 is formed from a transparent conductive film. In this case, the anode has to be light-transmissive because light generated in the light emitting layer 45 is emitted upward (toward the space above the TFTs). The transparent conductive film may contain a compound of indium oxide and tin oxide or a compound of an indium oxide and zinc oxide. Preferable material for the transparent conductive film is the one that can be deposited at as low temperature as possible, for the transparent conductive film is formed after forming the light emitting layer and the hole injection layer that have low heat resistance.

The anode 47 is thus formed to complete a light-emitting element, namely, EL element 2405. The EL element 2405 here refers to a capacitor consisting of the pixel electrode (cathode) 43, the light emitting layer 45, the hole injection layer 46 and the anode 47. The pixel electrode 43 covers almost the entire area of the pixel as shown in FIG. 6A, and hence the whole pixel functions as the EL element. Accordingly, efficiency in utilization of light emission is very high to provide bright image display.

On the anode 47, a second passivation film 48 is further formed. The second passivation film 48 is preferably a silicon nitride film or a silicon oxynitride film. The second passivation film is provided in order to cut communication between the EL element and the outside, thereby preventing degradation of the organic EL material due to oxidation as well as preventing degassing from the organic EL material. This enhances the reliability of the EL display device.

As has been described, the EL display device of the present invention has a pixel portion composed of pixels that have the structure shown in FIGS. 6A and 6B, and has a switching TFT that has a sufficiently low OFF current value and a current controlling TFT that is strong against hot carrier injection. The EL display device therefore has high reliability and is capable of quality image display.

FIG. 5B shows an example in which the structure of the light-emitting layer is inverted. A p-channel TFT is used for a current controlling TFT 2601. A transparent conductive film is used to form a pixel electrode (anode) 50. Specifically, a conductive film of a compound of indium oxide and zinc oxide is used. Of course, a conductive film of a compound of indium oxide and tin oxide may be used instead.

After forming banks 51a and 51b from an insulating film, the aforementioned light-emitting layer emitting white light is formed. In this case, a cathode 54 serves also as a passivation film. An EL element 2602 is thus completed. The light generated in a light emitting layer 53 in this case is emitted toward a substrate on which the TFT is formed as indicated by the arrow. In the structure as this, the current controlling TFT 2601 is preferably a p-channel TFT.

As described in the above, the method according to this embodiment includes moving the evaporation cells and the substrate relative to each other and providing a mechanism for associating opening and closing of the shutter with the movement. Therefore, a light emitting layer can be formed from an organic electroluminescence material on a large-area substrate to manufacture an EL display device.

Embodiment 2

The light-emitting device formed through carrying out the manufacturing method of the present invention may be applied to various electro-optical devices. Namely, the present invention can be employed in electronic equipment that incorporate those electro-optical devices and the semiconductor circuits as the parts.

As such electronic equipment, a video camera, a digital camera, a projector (rear type or front type) a head mount display (goggle-type display), a navigation system for vehicles, a car stereo, a personal computer, and a portable information terminal (a mobile computer, a cellular phone, or an electronic book, etc.) may be enumerated. Examples of those are shown in FIGS. 7A to 7F and FIGS. 8A to 8C.

Figure 7A:
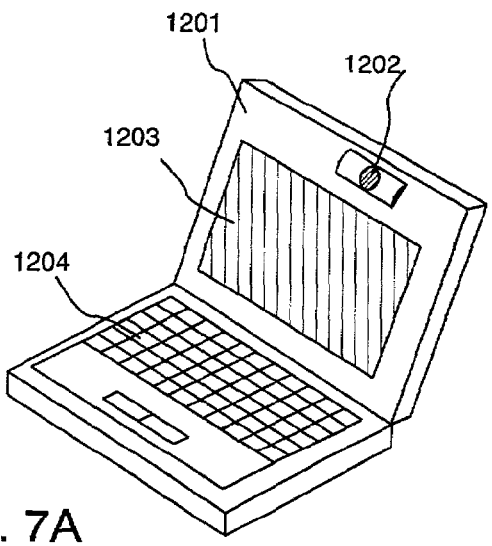
FIGS. 7A to 7F are diagrams showing examples of a semiconductor device.

FIG. 7A shows a personal computer, and includes a main body 1201, an image inputting portion 1202, a display portion 1203, a keyboard 1204, and the like. The present invention is applicable to the manufacture of the display portion 1203.

Figure 7B:
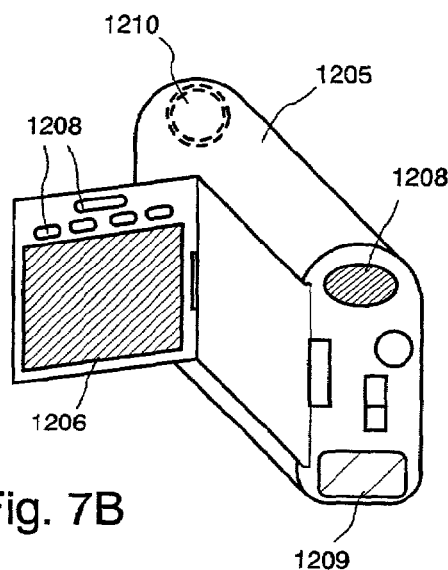

FIG. 7B shows a video camera, and includes a main body 1205, a display portion 1206, a voice input portion 1207, operation switches 1208, a battery 1209, and an image receiving portion 1210. The present invention is applicable to the manufacture of the display portion 1206.

Figure 7C:
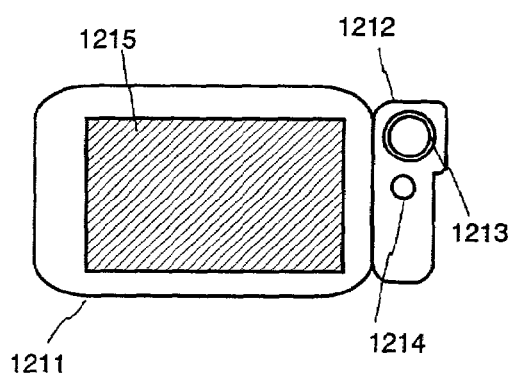

FIG. 7C shows a mobile computer, and includes a main body 1211, a camera portion 1212, an image receiving portion 1213, an operation switch 1214, and a display portion 1215. The present invention is applicable to the manufacture of the display portion 1215.

Figure 7D:
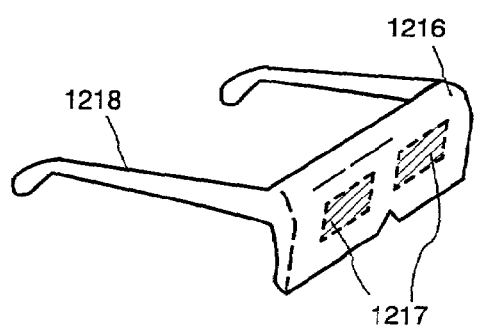

FIG. 7D shows a goggle-type display, and includes a main body 1216, a display portion 1217 and arm portions 1218. The present invention is applicable to the manufacture of the display portion 1217.

Figure 7E:
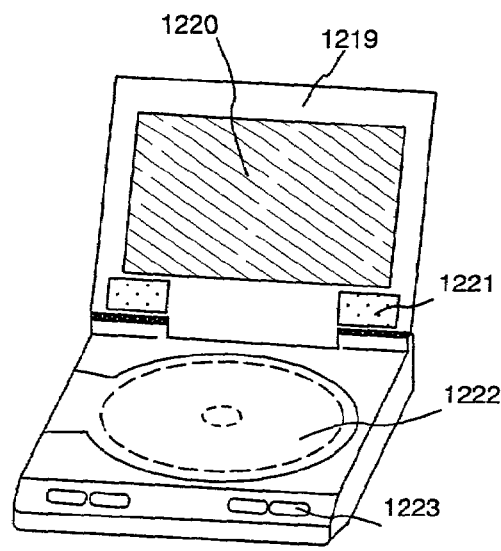

FIG. 7E shows a player that employs a recording medium in which programs are recorded (hereinafter referred to as a recording medium), and includes a main body 1219, a display portion 1220, a speaker portion 1221, a recording medium 1222, an operation switch 1223, and the like. Note that this device uses as the recording medium a DVD (digital versatile disc), a CD and the like to serve as a tool for enjoying music or movies, for playing video games and for connecting to the Internet. The present invention is applicable to the manufacture of the display portion 1220.

Figure 7F:
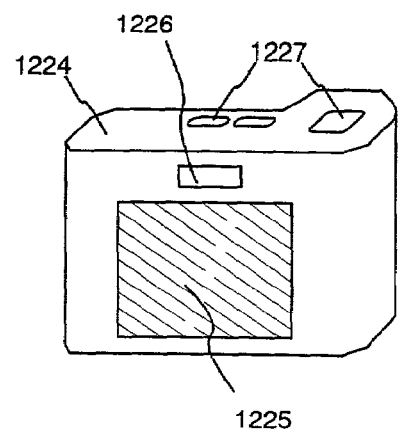

FIG. 7F shows a digital camera, and includes a main body 1224, a display unit 1225, an eye contact portion 1226, operation switches 1227, and an image receiving unit (not shown) and the like. The present invention is applicable to the manufacture of the display portion 1225.

Figure 8A:
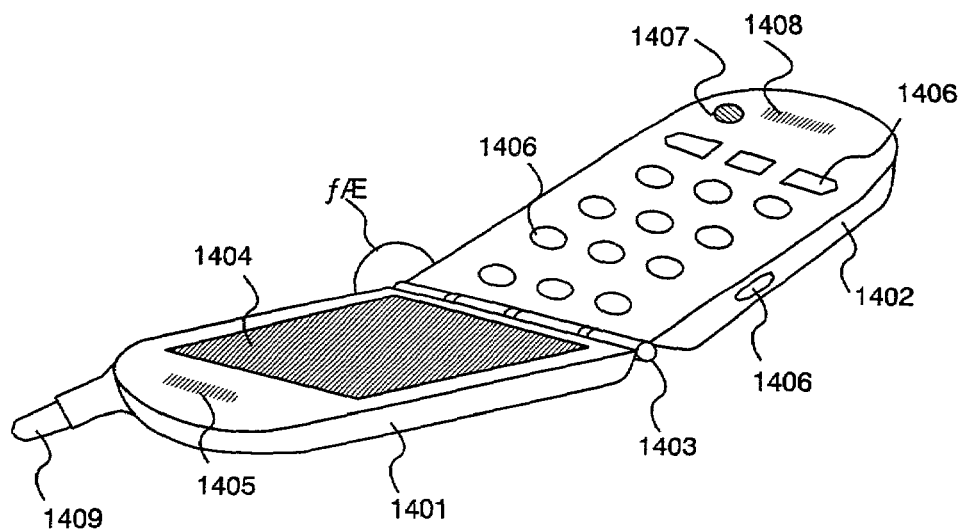
FIGS. 8A to 8C are diagrams showing examples of the semiconductor device.

FIG. 8A shows a cellular phone, and includes a display panel 1401, an operation panel 1402, a connection portion 1403, a display device 1404, an audio output portion 1405, operation keys 1406, a power switch 1407, an audio input portion 1408, an antenna 1409, and the like. The present invention is applicable to the display device 1404.

Figure 8B:
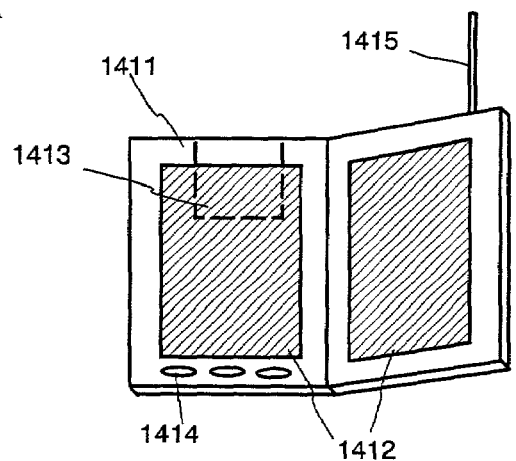

FIG. 8B shows a portable book (electronic book), and includes a main body 1411, display portions 1412, a recording medium 1413, operation switches 1414, an antenna 1415, and the like. The present invention is applicable to the manufacture of the display portion 1412.

Figure 8C:
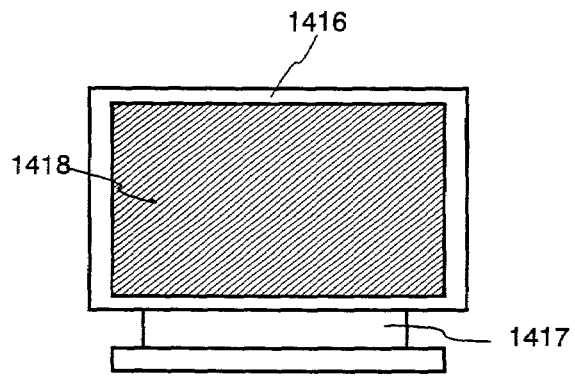

FIG. 8C shows a display, and includes a main body 1416, a support stand 1417, and a display portion 1418. The present invention can be applied to the display portion 1418. The display of the present invention is advantageous for cases of large size screens in particular, and is advantageous for displays having a diagonal equal to or greater than 10 inches (in particular, equal to or greater than 30 inches). In other words, as shown in Embodiment 1, the evaporation cell and the substrate are relatively moved, with the result that the organic electroluminescence layer can be uniformly formed on the large area substrate having one side exceeding 1 m. Therefore, the present invention makes it easy to manufacture the large-sized display easier.

As described above, application fields of the present invention is extremely broad, and is capable of being applied to every fields of electronic equipment. In particular, in the present invention, the evaporation cell and the substrate are relatively moved, and the movement is associated with of the shutter, which makes it possible to form the layer consisting of the organic electroluminescence material on the large-sized substrate to thereby manufacture the EL display device.

The present invention makes it possible to form, without using any shadow mask, a thin film having a highly uniform thickness throughout the substrate surface with high throughput.

What is claimed is:

1. A method of manufacturing a light-emitting device, comprising the steps of:
    forming a first thin film transistor for switching a first pixel and a second thin film transistor for switching a second pixel adjacent to the first pixel over a substrate;
    forming a first pixel electrode electrically connected to the first thin film transistor and a second pixel electrode electrically connected to the second thin film transistor;
    forming a bank between the first pixel electrode and the second pixel electrode;
    preparing a first evaporation cell filled with a first organic electroluminescence material and a second evaporation cell filled with a second organic electroluminescence material; and
    evaporating the first and the second organic electroluminescence materials in an inert gas atmosphere at an atmospheric pressure by heating the first and the second evaporation cells which are controlled by a heating means so that a first light emitting layer pattern comprising the first organic electroluminescence material is formed over the first pixel electrode without using a mask and a second light emitting layer pattern comprising the second organic electroluminescence material is formed over the second pixel electrode without using a mask,
    wherein the first light emitting layer pattern is electrically connected to the first pixel electrode and the second light emitting layer pattern is electrically connected to the second pixel electrode;
    wherein each of the first and the second evaporation cells comprises a first portion and a second portion having an inner diameter smaller than that of the first portion, and
    wherein the first and the second organic electroluminescence materials are ejected from an end portion of the second portion.

2. A method of manufacturing a light-emitting device as claimed in claim 1, wherein the light-emitting device is a device selected from the group of: a personal computer, a video camera, a goggle-type display, a digital camera and a cellular phone.

3. A method of manufacturing a light-emitting device as claimed in claim 1, wherein the first and the second organic electroluminescence materials are small molecule materials.

4. A method of manufacturing a light-emitting device as claimed in claim 1, wherein the inert gas comprises argon.

5. A method of manufacturing a light-emitting device according to claim 1, wherein each of the first and the second evaporation cells comprises a material selected from the group consisting of boron nitride, alumina and tungsten.

6. The method of manufacturing a light-emitting device according to claim 1 wherein the first and the second light emitting layer patterns are directly deposited from the first and the second evaporation cells respectively.

7. A method of manufacturing a light-emitting device according to claim 1, wherein each of the first and the second light emitting layer patterns has a width of about 50 to 200 μm.

8. A method of manufacturing a light-emitting device according to claim 1, wherein a diameter of the second portion is several tens to several hundreds μm.

9. A method of manufacturing a light-emitting device, comprising the steps of:
    forming a first thin film transistor for switching a first pixel and a second thin film transistor for switching a second pixel adjacent to the first pixel over a substrate;
    forming a first pixel electrode electrically connected to the first thin film transistor and a second pixel electrode electrically connected to the second thin film transistor;
    forming a bank between the first pixel electrode and the second pixel electrode;
    placing in a reaction chamber a first evaporation cell containing a first organic electroluminescence material and a second evaporation cell containing a second organic electroluminescence material, and placing a shutter above the first and the second evaporation cells; and
    evaporating the first and the second organic electroluminescence materials in an inert gas atmosphere at an atmospheric pressure by heating the first and the second evaporation cells which are controlled by a heating means so that a first light emitting layer pattern comprising the first organic electroluminescence material is formed over the first pixel electrode without using a mask by opening and closing the shutter and a second light emitting layer pattern comprising the second organic electroluminescence material is formed over the second pixel electrode without using a mask by opening and closing the shutter,
    wherein the first light emitting layer pattern is electrically connected to the first pixel electrode and the second light emitting layer pattern is electrically connected to the second pixel electrode;
    wherein the heating means is placed outside the reaction chamber;
    wherein each of the first and the second evaporation cells comprises a first portion and a second portion having an inner diameter smaller than that of the first portion, and wherein the first and the second organic electroluminescence materials are ejected from an end portion of the second portion.

10. A method of manufacturing a light-emitting device as claimed in claim 9, wherein the light-emitting device is a device selected from the group of: a personal computer, a video camera, a goggle-type display, a digital camera and a cellular phone.

11. A method of manufacturing a light-emitting device as claimed in claim 9, wherein the first and the second organic electroluminescence materials are small molecule materials.

12. A method of manufacturing a light-emitting device as claimed in claim 9, wherein the inert gas comprises argon.

13. A method of manufacturing a light-emitting device according to claim 9, wherein each of the first and the second evaporation cells comprises a material selected from the group consisting of boron nitride, alumina and tungsten.

14. A method of manufacturing a light-emitting device according to claim 9, wherein a diameter of the second portion is several tens to several hundreds μm.

15. The method of manufacturing a light-emitting device according to claim 9 wherein the first and the second light emitting layer patterns are directly deposited from the first and the second evaporation cells respectively.

16. A method of manufacturing a light-emitting device according to claim 9, wherein each of the first and the second light emitting layer patterns has a width of about 50 to 200 μm.

17. A method of manufacturing a light-emitting device, comprising the steps of:
   forming a first thin film transistor for switching a first pixel and a second thin film transistor for switching a second pixel adjacent to the first pixel over a substrate;
   forming a first pixel electrode electrically connected to the first thin film transistor and a second pixel electrode electrically connected to the second thin film transistor;
   forming a bank between the first pixel electrode and the second pixel electrode;
   preparing a first evaporation cell filled with a first organic electroluminescence material and a second evaporation cell filled with a second organic electroluminescence material;
   evaporating the first and the second organic electroluminescence materials in an inert gas atmosphere at an atmospheric pressure by heating the first and the second evaporation cells which are controlled by a heating means so that a first light emitting layer pattern comprising the first organic electroluminescence material is formed over the first pixel electrode without using a mask and a second light emitting layer pattern comprising the second organic electroluminescence material is formed over the second pixel electrode without using a mask; and
   moving the first and the second evaporation cells and the substrate relative to each other,
   wherein the first light emitting layer pattern is electrically connected to the first pixel electrode and the second light emitting layer pattern is electrically connected to the second pixel electrode;
   wherein each of the first and the second evaporation cells comprises a first portion and a second portion having an inner diameter smaller than that of the first portion, and
   wherein the first and the second organic electroluminescence materials are ejected from an end portion of the second portion.

18. A method of manufacturing a light-emitting device according to claim 17, wherein the first and the second evaporation cells are moved.

19. A method of manufacturing a light-emitting device according to claim 17, wherein each of the first and the second evaporation cells comprises a material selected from the group consisting of boron nitride, alumina and tungsten.

20. A method of manufacturing a light-emitting device according to claim 17, wherein the substrate is moved in X-Y directions.

21. A method of manufacturing a light-emitting device according to claim 17, wherein each of the first and the second light emitting layer patterns has a width of about 50 to 200 μm.

22. A method of manufacturing a light-emitting device according to claim 17, wherein a diameter of the second portion is several tens to several hundreds μm.

23. A method of manufacturing a light-emitting device, comprising the steps of:
   forming a first thin film transistor for switching a first pixel and a second thin film transistor for switching a second pixel adjacent to the first pixel over a substrate;
   forming a first pixel electrode electrically connected to the first thin film transistor and a second pixel electrode electrically connected to the second thin film transistor;
   forming a bank between the first pixel electrode and the second pixel electrode;
   placing in a reaction chamber a first evaporation cell containing a first organic electroluminescence material and a second evaporation cell containing a second organic electroluminescence material, and placing a shutter above the first and the second evaporation cells;
   evaporating the first and the second organic electroluminescence materials in an inert gas atmosphere at an atmospheric pressure by heating the first and the second evaporation cells which are controlled by a heating means so that a first light emitting layer pattern comprising the first organic electroluminescence material is formed over the first pixel electrode without using a mask by opening and closing the shutter and a second light emitting layer pattern comprising the second organic electroluminescence material is formed over the second pixel electrode without using a mask by opening and closing the shutter; and
   moving the first and the second evaporation cells and the substrate relative to each other,
   wherein the first light emitting layer pattern is electrically connected to the first pixel electrode and the second light emitting layer pattern is electrically connected to the second pixel electrode;
   wherein the heating means is placed outside the reaction chamber;
   wherein each of the first and the second evaporation cells comprises a first portion and a second portion having an inner diameter smaller than that of the first portion, and
   wherein the first and the second organic electroluminescence materials are ejected from an end portion of the second portion.

24. A method of manufacturing a light-emitting device according to claim 23, wherein the first and the second evaporation cells are moved.

25. A method of manufacturing a light-emitting device according to claim 23, wherein each of the first and the second evaporation cells comprises a material selected from the group consisting of boron nitride, alumina and tungsten.

26. A method of manufacturing a light-emitting device according to claim 23, wherein a diameter of the second portion is several tens to several hundreds μm.

27. A method of manufacturing a light-emitting device according to claim 23, wherein the substrate is moved in X-Y directions.

28. A method of manufacturing a light-emitting device according to claim 23, wherein each of the first and the second light emitting layer patterns has a width of about 50 to 200 μm.

* * * * *